(12) United States Patent
Lee et al.

(10) Patent No.: US 8,058,735 B2
(45) Date of Patent: Nov. 15, 2011

(54) WAFER-LEVEL CHIP SCALE PACKAGE HAVING STUD BUMP AND METHOD FOR FABRICATING THE SAME

(75) Inventors: Sang-do Lee, Bucheon (KR); Yoon-hwa Choi, Incheon (KR)

(73) Assignee: Fairchild Korea Semiconductor LTD (KR)

( * ) Notice: Subject to any disclaimer, the term of this patent is extended or adjusted under 35 U.S.C. 154(b) by 2034 days.

(21) Appl. No.: 10/295,281

(22) Filed: Nov. 15, 2002

(65) Prior Publication Data

US 2003/0090884 A1 May 15, 2003

(51) Int. Cl.
 *H01L 23/48* (2006.01)
 *H01L 23/52* (2006.01)
 *H01L 29/40* (2006.01)

(52) U.S. Cl. ............... 257/786; 257/781; 438/614

(58) Field of Classification Search ............... 257/784, 257/780, 781, 758, 779, 783, 786; 438/613, 438/614, 108
See application file for complete search history.

(56) References Cited

U.S. PATENT DOCUMENTS

| | | | | |
|---|---|---|---|---|
| 5,092,033 | A | 3/1992 | Nishiguchi et al. | 29/840 |
| 5,501,004 | A | 3/1996 | Onitsuka | 29/827 |
| 5,559,054 | A * | 9/1996 | Adamjee | 438/617 |
| 5,877,549 | A | 3/1999 | Kim | 257/693 |
| 5,925,931 | A * | 7/1999 | Yamamoto | 257/737 |
| 5,928,458 | A | 7/1999 | Aschenbrenner et al. | |
| 5,949,142 | A | 9/1999 | Otsuka | 257/737 |
| 5,986,334 | A | 11/1999 | Lee | 257/667 |
| 6,013,948 | A | 1/2000 | Akram et al. | 257/698 |
| 6,039,896 | A | 3/2000 | Miyamoto et al. | 252/511 |
| 6,111,317 | A * | 8/2000 | Okada et al. | 257/737 |
| 6,150,717 | A | 11/2000 | Wood et al. | 257/738 |
| 6,187,615 | B1 | 2/2001 | Kim et al. | 438/113 |
| 6,190,509 | B1 | 2/2001 | Haba | 204/164 |
| 6,239,482 | B1 | 5/2001 | Fillion et al. | 257/678 |
| 6,252,301 | B1 | 6/2001 | Gilleo et al. | 257/690 |
| 6,287,893 | B1 | 9/2001 | Elenius et al. | 438/108 |

(Continued)

FOREIGN PATENT DOCUMENTS

KR    2001-0009429    2/2001

(Continued)

OTHER PUBLICATIONS

John H. Lau(Ed.), *Flip Chip Technologies* (1996), pp. 301-314, McGraw-Hill, Boston, Massachusetts, USA.

*Primary Examiner* — Sheila V Clark
(74) *Attorney, Agent, or Firm* — Kirton & McConkie; Kenneth E. Horton (57) ABSTRACT

A wafer level chip scale package having stud bumps and a method for fabricating the same are described. The wafer level chip scale package includes a silicon substrate having a passivation layer and a chip pad on its top surface; a stud bump being formed on the chip pad and encircled by a first insulating layer; a re-distributed line (RDL) pattern being formed on the same horizontal surface as the first insulating layer and the stud bump, the RDL pattern for connecting the stud bump and a solder bump; a second insulating layer for insulating the RDL pattern so that a portion of the RDL pattern that is connected with the solder bump is exposed; and the solder bump being attached to the exposed portion if the RDL pattern.

29 Claims, 11 Drawing Sheets

U.S. PATENT DOCUMENTS

| | | | |
|---|---|---|---|
| 6,294,405 B1 | 9/2001 | Higgins, III | 438/108 |
| 6,300,675 B1 | 10/2001 | Tamai | 257/668 |
| 6,336,990 B1 | 1/2002 | Tanaka et al. | 156/306.9 |
| 6,350,668 B1 | 2/2002 | Chakravorty | 438/612 |
| 6,362,087 B1 | 3/2002 | Wang et al. | 438/597 |
| 6,368,896 B2 | 4/2002 | Farnworth et al. | 438/113 |
| 6,392,305 B1 | 5/2002 | Huang et al. | 257/782 |
| 6,396,557 B1 | 5/2002 | Tajima | 349/150 |
| 6,407,459 B2 * | 6/2002 | Kwon et al. | 257/780 |
| 6,407,508 B1 | 6/2002 | Kawada et al. | 315/169.3 |
| 6,417,089 B1 | 7/2002 | Kim et al. | 438/612 |
| 6,441,498 B1 | 8/2002 | Song | 257/778 |
| 6,468,830 B1 | 10/2002 | Carson | 438/106 |
| 6,509,634 B1 | 1/2003 | Lee et al. | |
| 6,512,298 B2 * | 1/2003 | Sahara et al. | 257/773 |
| 6,518,091 B1 | 2/2003 | Haba | 438/107 |
| 6,518,097 B1 | 2/2003 | Yim et al. | 438/119 |
| 6,528,344 B2 | 3/2003 | Kang | 438/106 |
| 6,549,413 B2 * | 4/2003 | Karnezos et al. | 361/704 |
| 6,555,917 B1 | 4/2003 | Heo | 257/777 |
| 6,566,748 B1 | 5/2003 | Shimizu et al. | 257/704 |
| 6,577,008 B2 * | 6/2003 | Lam et al. | 257/750 |
| 6,590,295 B1 * | 7/2003 | Liao et al. | 257/781 |
| 6,611,052 B2 | 8/2003 | Poo et al. | 257/686 |
| 6,621,164 B2 * | 9/2003 | Hwang et al. | 257/738 |
| 6,621,286 B2 | 9/2003 | Takada et al. | 324/765 |
| 2004/0191955 A1 | 9/2004 | Joshi et al. | |
| 2005/0012225 A1 | 1/2005 | Choi et al. | |
| 2005/0176233 A1 | 8/2005 | Joshi et al. | |

FOREIGN PATENT DOCUMENTS

KR    2001-0009564    2/2001

* cited by examiner

WAFER-LEVEL CHIP SCALE PACKAGE HAVING STUD BUMP AND METHOD FOR FABRICATING THE SAME

FIELD OF THE INVENTION

The invention generally relates to methods for fabricating integrated circuits (ICs) and semiconductor devices and the resulting structures. Specifically, the invention relates to a semiconductor package and a method for fabricating the same. More particularly, the invention relates to a wafer level chip scale package having stud bumps and a method for fabricating the same.

BACKGROUND OF THE INVENTION

Advancement in the electronics industry, e.g., personal computers (PC), mobile phones, and personal data assistants (PDA), triggers a need for light, compact, and multi-functional power systems that are capable of processing a lot of data at a time. This need also causes a reduction in the size of semiconductor packages according to the size of a semiconductor chip, i.e., wafer-level chip size package (WLCSP).

In general, in order to fabricate the WLCSP, a wafer can be packaged by a photolithography process and a sputtering process right after the wafer is processed. This method is much easier than a general wafer level packaging process during which dye bonding, wire bonding, and molding are carried out. Further, using the WLCSP, it is possible to make solder bumps for all chips formed on a wafer at a time. In addition, a wafer-level test on the operations of each chip is possible during the WLSCP method. For these and other reasons, a WLCSP can be fabricated at a lower cost than general packaging for semiconductor devices.

Figure 1:
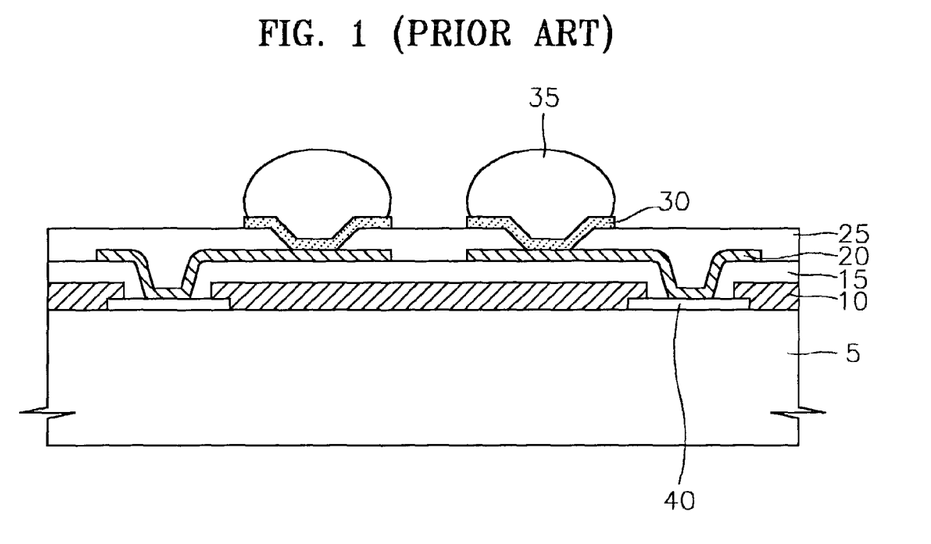
FIG. 1 is a cross-sectional view of a conventional wafer-level chip scale page.
Figure 2:
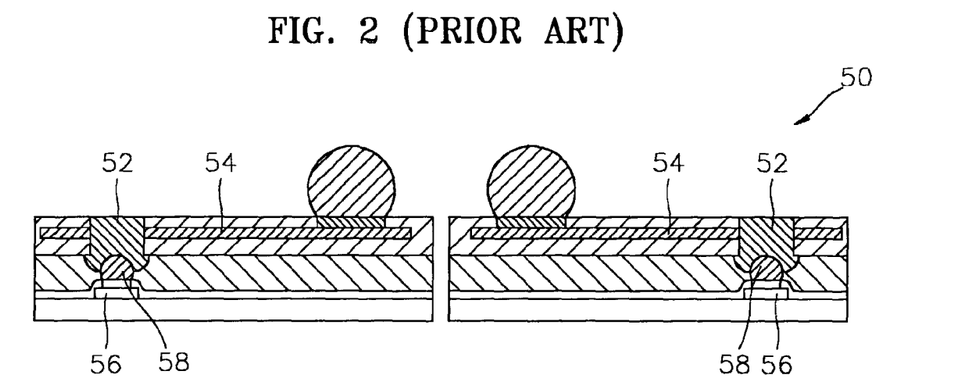
FIG. 2 is a cross-sectional view of another conventional wafer-level chip scale package.
Figure 3:
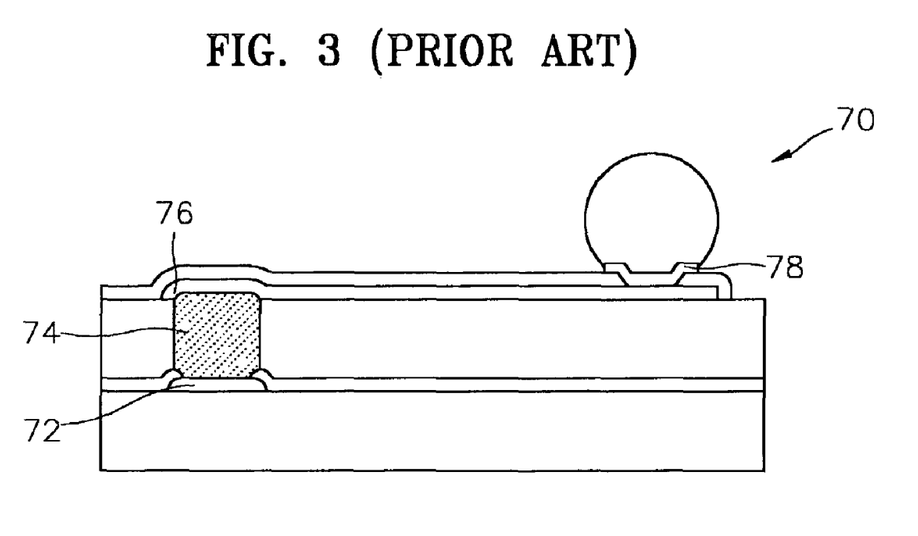
FIG. 3 is a cross-sectional view of another conventional wafer-level chip scale package.

FIGS. 1 through 3 are cross-sectional views of conventional wafer-level chip scale packages. Referring to FIG. 1, chip pads 40 are formed of a metal material such as aluminum on a silicon substrate 5. A passivation layer 10 is formed to expose a portion of each of the chip pads 40 on the silicon substrate 5, thereby protecting the silicon substrate 5. A first insulating layer 15 is formed to cover the passivation layers 10, and then a re-distribution line (RDL) pattern 20 is formed on portions of the first insulating layer 15 and the exposed chip pads 40. A second insulating layer 25 is formed on the RDL pattern 20 while exposing portions of the RDL pattern 20. Under bump metals (UBM) 30 are formed between solder bumps 35 and the exposed portions of the RDL pattern 20.

The RDL pattern 20 includes inclined portions when re-distributed on the first insulating layer 15 from the chip pads 40. Thus, short circuits may occur when forming the RDL pattern 20, or the RDL pattern 20 may be cracked due to stresses. Referring to FIG. 2, in a conventional wafer-level chip scale package 50, a RDL pattern 54 adheres to a solder connection 52 in the form of a cylindrical band. Therefore, a contact area between the RDL pattern 54 and the solder connection 52 is reduced, thereby deteriorating the electrical characteristics therebetween. Further, short circuits may occur due to stresses in a contact surface between the RDL pattern 54 and the solder connection 52. Also, the solder connection 52, which is connected with a solder bump 58 formed on a chip pad 56, is exposed to the outside of the wafer-level chip scale package 50, i.e., to air. Thus, there is a higher possibility that moisture penetrates into the solder connection 52, which would lower the reliability of the solder connection 52. In addition, the wafer-level chip scale package 50 is completed by carrying out several processes, and therefore manufacturing costs are increased.

Referring to FIG. 3, in a conventional wafer-level chip scale package 60, a RDL pattern 76 is electrically connected with a chip pad 72 via a connection bump 74. The RDL pattern 76 is, however, inclined on the connection bump 74, thereby causing cracks therein due to stresses. Also, the connection bump 74 is made by performing a plating process, thereby being formed of aluminum, copper, silver, or an alloy thereof. Accordingly, the conventional wafer-level chip scale package 60 is not easy to manufacture.

SUMMARY OF THE INVENTION

The invention provides a wafer-level chip scale package including a re-distributed line (RDL) pattern that is not inclined between the bottom of a solder bump and the top surface of a chip pad. The invention also provides a method of fabricating such a wafer-level chip scale package.

The wafer-level chip scale package of the invention includes a silicon substrate having a passivation layer and a chip pad on its top surface; a stud bump being formed on the chip pad and encircled by a first insulating layer; a planar re-distributed line (RDL) pattern being formed on the same horizontal surface as the first insulating layer and the stud bump, the RDL pattern for connecting the stud bump and a solder bump; a second insulating layer for insulating the RDL pattern so that a portion of the RDL pattern that is connected with the solder bump is exposed; and a solder bump being attached to the exposed portion of the RDL pattern.

In the invention, the stud bump can comprise a material selected from Au and Cu. The RDL pattern can formed to cover the entire top surface of the stud bump or to cover a portion thereof. The RDL pattern can comprise a composite layer of Cu, Al, Cr, and Cu. Alternatively, the RDL pattern comprises a material selected from NiV and Ti. The first and second insulating layers can comprise a material selected from the group of BCB, PI, and EMC. The top surface of the stud bump can be aligned with the top surface of the first insulating layer. Alternatively, the wafer-level chip scale package further includes intermediate RDL patterns, additional stud bumps, and an additional insulating layer between the tops of the stud bump and the first insulating layer and between the RDL pattern and the second insulating layer.

The invention is also directed to a method of fabricating such a wafer-level chip scale package by (a) preparing a silicon substrate having a passivation layer and a chip pad; (b) forming a stud bump on the chip pad; (c) depositing a first insulating layer on the stud bump and the chip pad; (d) planarizing the stud bump and the first insulating layer until the stud bump is exposed; (e) forming an RDL pattern on the planarized stud bump and first insulating layer for electrically connecting the stud bump and a solder bump; (f) forming a second insulating layer on the RDL pattern and the first insulating layer so that a portion of the RDL pattern, which is connected with the solder bump, is exposed; and (g) attaching the solder bump to the exposed portion of the RDL pattern. In the invention during step (b) a bonding wire is formed to be coined on the chip pad using a capillary.

Using the invention, it is possible to form an RDL pattern without an inclined portion, thus reducing the tendency of the RDL pattern to crack. Further, a stud bump can be easily and inexpensively formed using a capillary.

BRIEF DESCRIPTION OF THE DRAWINGS

FIGS. 1-11 are views of one aspect of the devices and methods of making the devices according to the invention, in which:

FIGS. 1-11 presented in conjunction with this description are views of only particular—rather than complete—portions of the devices and methods of making the devices according to the invention. Together with the following description, the Figures demonstrate and explain the principles of the invention.

DETAILED DESCRIPTION OF THE INVENTION

The invention now will be described more fully with reference to the accompanying drawings, in which one aspect of the invention is shown. This invention may, however, be embodied in many different forms and should not be construed as being limited to the aspects set forth herein; rather, these aspects are provided so that this disclosure will be thorough and complete and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. The same reference numerals in different drawings represent the same element, and thus their descriptions will be omitted.

Figure 4:
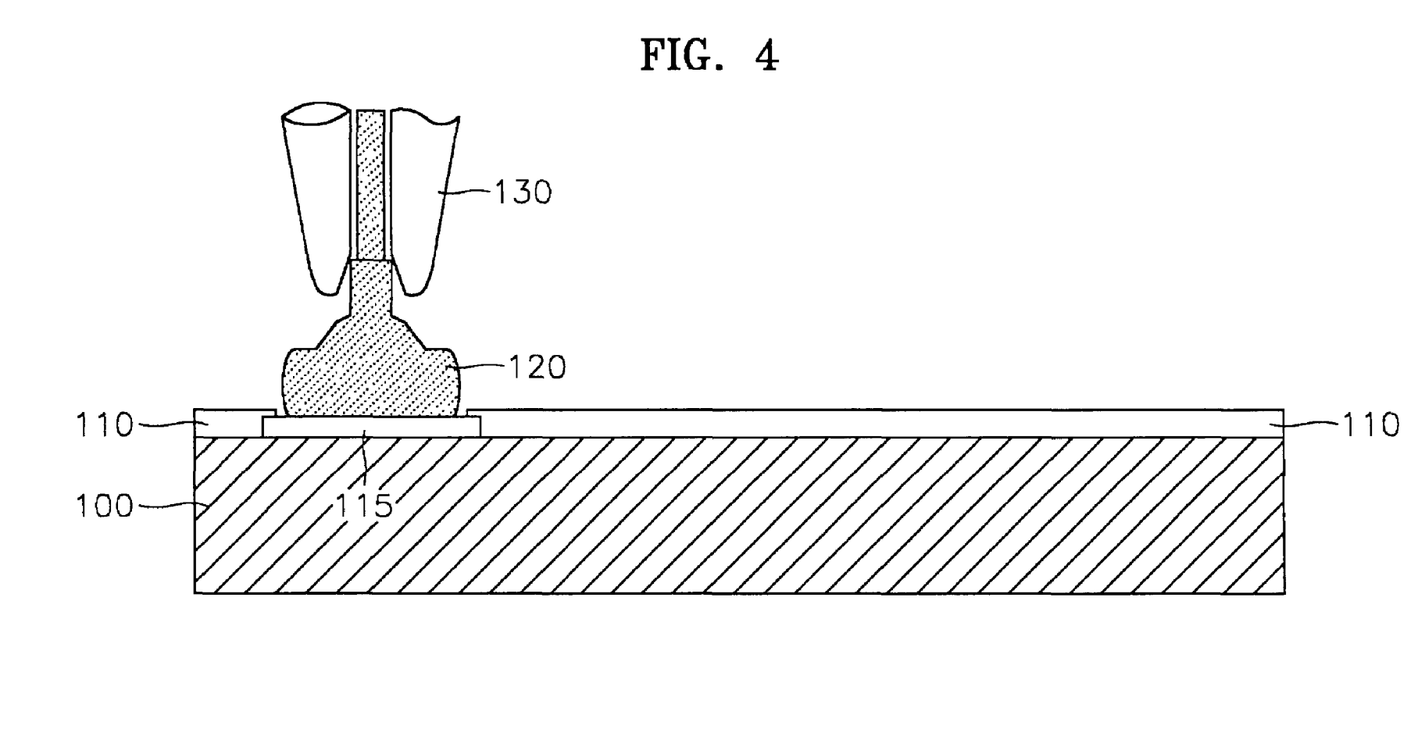
FIG. 4 is a cross-sectional view showing a stage in a method of fabricating a wafer-level chip scale package according to an aspect of the invention.

FIGS. 4 through 10 are cross-sectional views for explaining a method of fabricating a wafer-level chip scale package according to one aspect of the invention. Referring to FIG. 4, a silicon substrate 100 is prepared on which a passsivation layer 110 and a chip pad 115 are formed. Then, the chip pad 115 is bonded to a wire 120 using a capillary 130.

Figure 5:
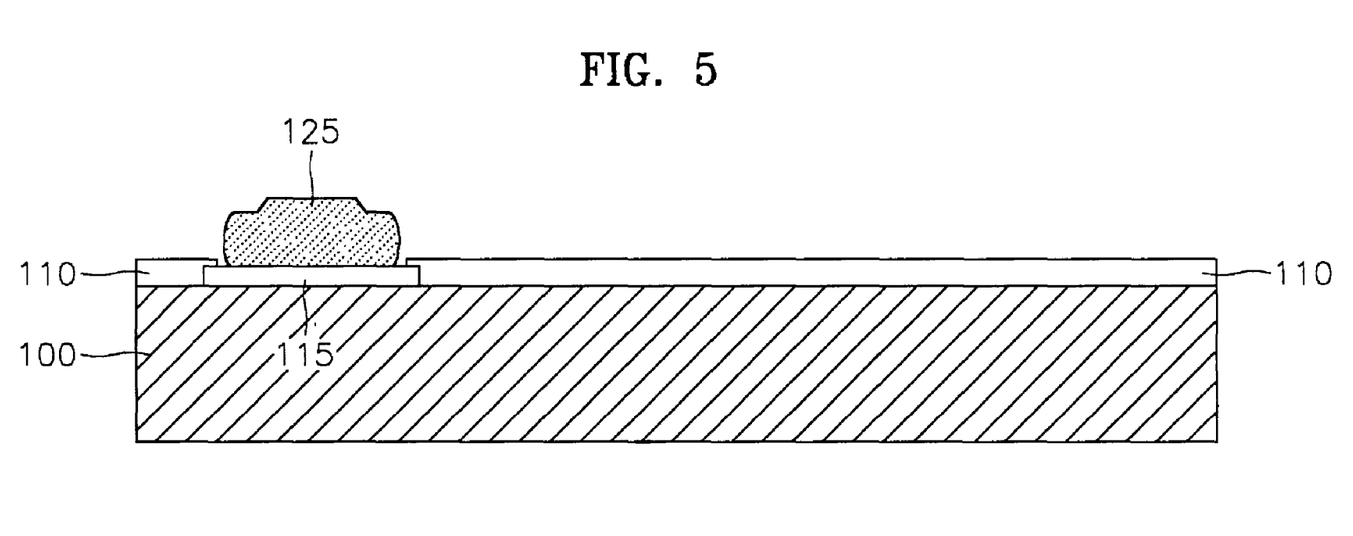
FIG. 5 is a cross-sectional view showing a stage in a method of fabricating a wafer-level chip scale package according to an aspect of the invention.

As shown in FIG. 5, the bottom of the wire 120 is completely bonded with the chip pad 115. Then a coining process is performed to press the wire 120 under a predetermined pressure, thereby forming a coined stud bump 125. By using the capillary 130 as shown in FIG. 4, the coined stud bump 125 may be formed to have a simple structure.

Figure 6:
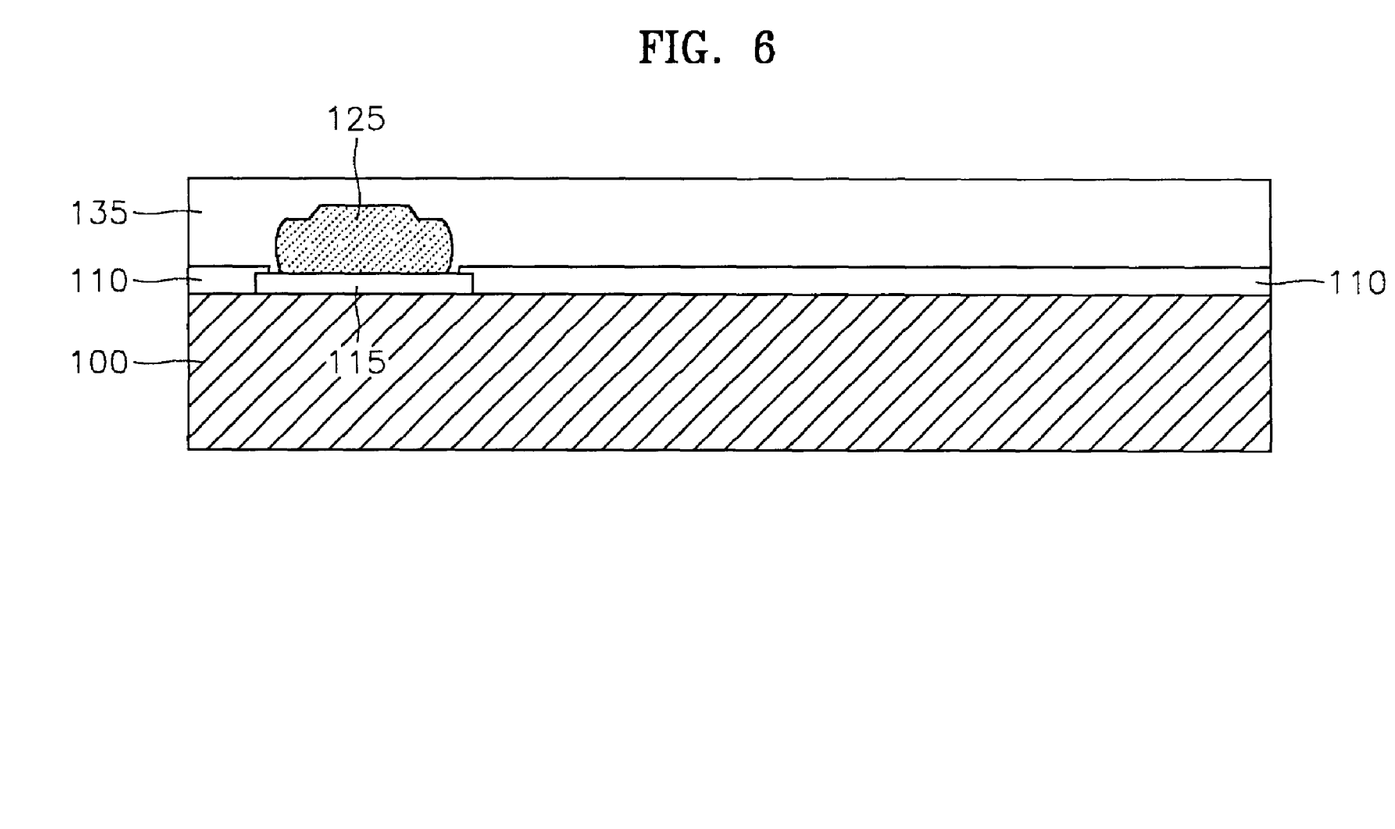
FIG. 6 is a cross-sectional view showing a stage in a method of fabricating a wafer-level chip scale package according to an aspect of the invention.

As depicted in FIG. 6, a first insulating layer 135 is tehn deposited to entirely cover the entire coined stud bump 125 and the passivation layer 110. In one aspect of the invention, the first insulting layer 135 is formed of a material selected from BCB, PI, and EMC.

Figure 7:
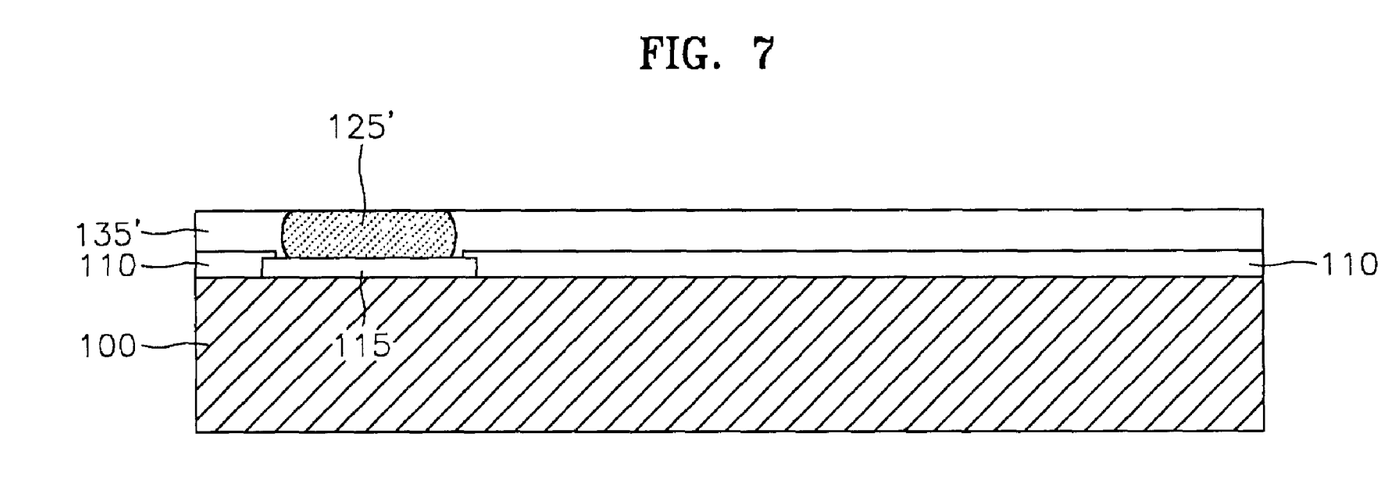
FIG. 7 is a cross-sectional view showing a stage in a method of fabricating a wafer-level chip scale package according to an aspect of the invention.

Then, as illustrated in FIG. 7, the first insulating layer 135 of FIG. 6 is planarized together with the coined stud bump 125 of FIG. 6 to form a stud bump 125' and a first insulating layer 135'. Preferably, chemical mechanical polishing (CMP) is used to planarize the first insulating layer 135 and the stud bump 125.

Figure 8:
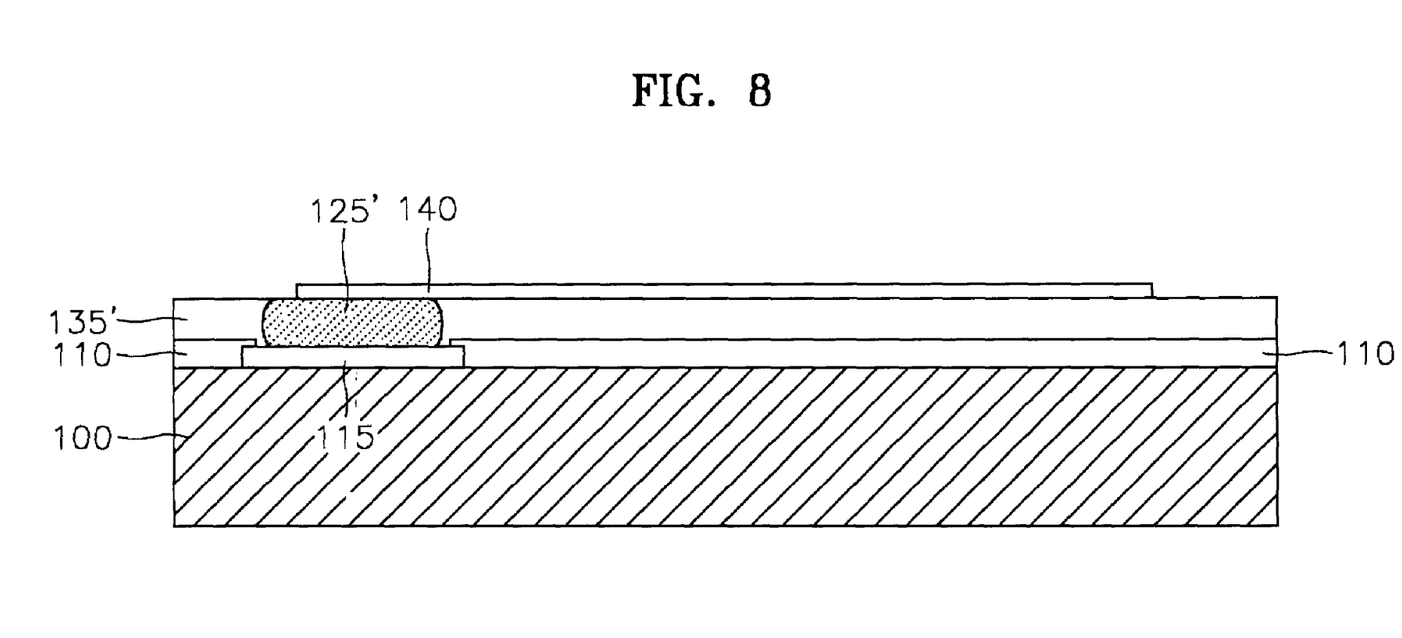
FIG. 8 is a cross-sectional view showing a stage in a method of fabricating a wafer-level chip scale package according to an aspect of the invention.

Thereafter, as shown in FIG. 8, a re-distributed line (RDL) pattern 140 is formed on the stud bump 125' and the first insulating layer 135'. The RDL pattern 140 electrically connects the stud bump 125' and the solder bump, which is to be formed during subsequent processing. Preferably, the RDL pattern 140 is formed of a composite layer of Cu, Al, Cr, and Cu. Alternatively, the RDL pattern 140 may be formed of a material selected from NiV and Ti.

Figure 9:
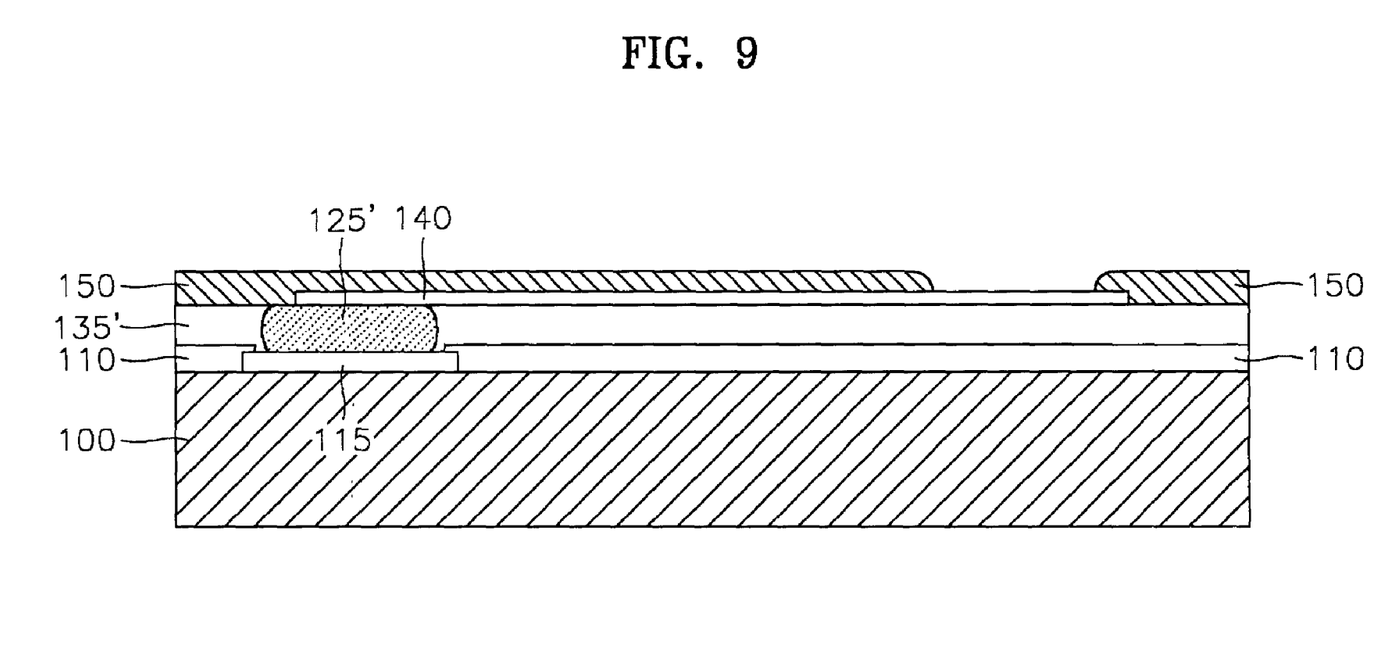
FIG. 9 is a cross-sectional view showing a stage in a method of fabricating a wafer-level chip scale package according to an aspect of the invention.

Then, as depicted in FIG. 9, a second insulating layer 150 is formed to cover the RDL pattern 140 and the first insulating layer 135'. The second insulating layer 150 exposes a portion of the RDL pattern 140 to which a solder bump is later attached.

Figure 10:
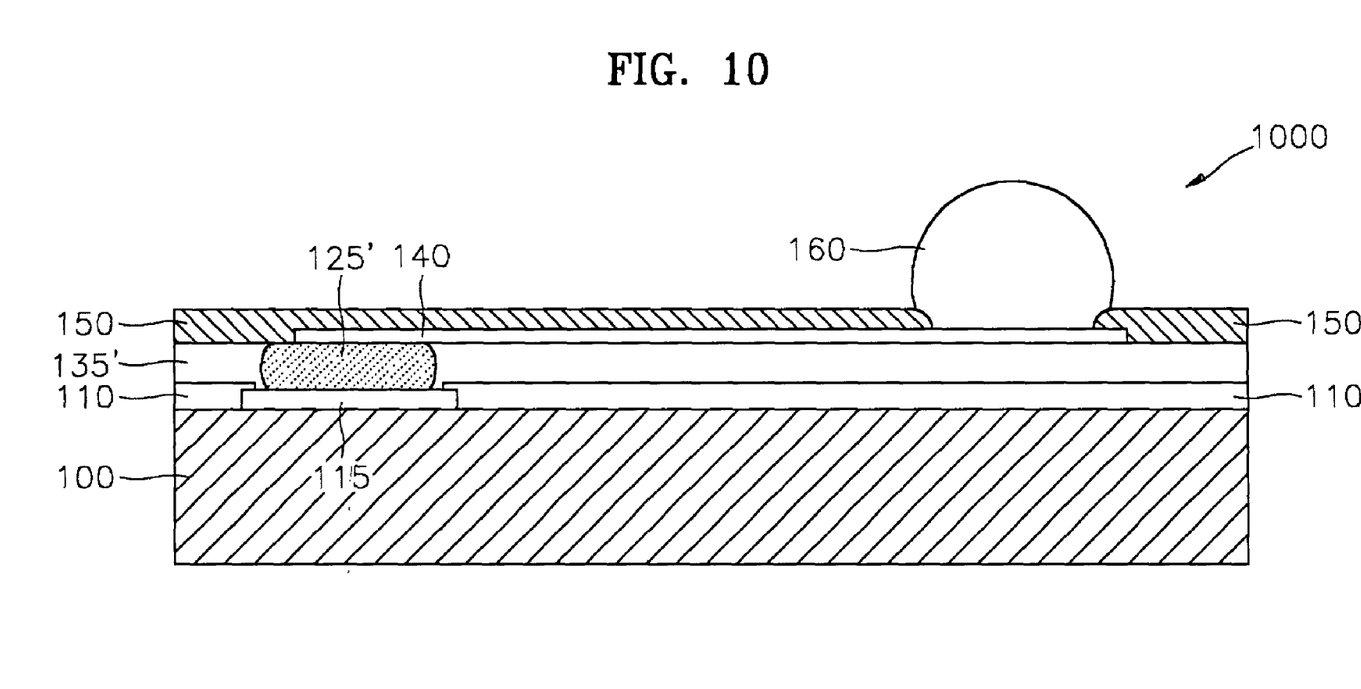
FIG. 10 is a cross-sectional view showing a stage in a method of fabricating a wafer-level chip scale package according to an aspect of the invention.

Next, as shown in FIG. 10, a solder bump 160 is attached to an exposed portion of a RDL pattern 150. The solder bump 160 transmits electrical signals output from the chip pad 115 to the outside of the semiconductor package.

A wafer-level chip scale package 1000 made by the above method includes a silicon substrate 100 having the passivation layer 110 and the chip pad 115; a stud bump 125' that is formed on the chip pad 115 and is encircled by the first insulating layer 135'; an RDL pattern 140 that electrically connects the stud bump 125' and the solder bump 160; a second insulating layer 150 that insulates the RDL pattern 140; and a solder bump 160 that is electrically connected to an exposed portion of the RDL pattern 140.

The silicon substrate 100 includes the chip pad 115, which is a path through which electrical signals are transmitted to the outside, on its upper portion. The chip pad 115 extends into the passivation layer 110 to be encircled by the passivation layer 110. Preferably, the chip pad 115 is formed of aluminum.

As described above, the stud bump 125' is made by bonding the wire 120 with the chip pad 115 using the capillary 130 and performing the coining process thereon. Thus, the stud bump 125' is simple and easy to manufacture. Preferably, the stud bump is formed of gold (Au) or copper (Cu).

The first insulating layer 135' encircles and covers the stud bump 125'. A planarizing process is performed on the top surface of the first insulating layer 135' and stud bump 125' so that their top surfaces may be coplanar in one aspect of the invention. Accordingly, the RDL pattern 140 may be formed without an inclined portion where the stud bump 125' interfaces with the first insulating layer 135'. Preferably, the first insulating layer 135' comprises one of BCB, PI, and EMC.

The RDL pattern 140 is in communication with the top surface of the stud bump 125'. Although the RDL pattern 140 is illustrated to be formed on only a portion of the upper surface of the stud bump 125', it may be formed to cover the entire stud bump 125', thus enhancing the electrical characteristics and reliability of the wafer-level chip scale package 1000.

The RDL pattern 140 is used to establish the position of the solder bump 160, to which electrical signals output from the chip pad 115 are transmitted, as well as to connect the stud bump 125' and the solder bump 160 electrically. The RDL pattern 140 may be regarded as a planar RDL pattern because it is formed on the first insulating layer 135' and the stud bump 125' without inclined portions. Therefore, cracks in the RDL pattern 140 due to stresses are prevented. Also, the RDL pattern 20 of FIG. 1 includes an inclined portion in conventional wafer-level chip scale package, and thus it is impossible to form the first insulating layer 15 of FIG. 1 thickly. In contrast, the first insulating layer 135' is formed thickly in a wafer-level chip scale package 1000 according to the invention.

Preferably, the RDL pattern 140 is formed of either a composite layer of Cu, Al, Cr, and Cu, or a material selected from NiV and Ti. In conventional wafer-level chip scale package, the RDL pattern 20 of FIG. 1 may be formed of a stacked material where Al, NiV, Cu, NiV, and Cu are sequentially deposited on the chip pad 40 of FIG. 1. Therefore, the conventional RDL pattern 20 has poor adhesive characteristics and reliability. Further, it is not easy to fabricate, and its manufacturing costs are great.

The second insulating layer 150 is an insulating layer formed on the RDL pattern 140, the first insulating layer 135' and the stud bump 125' and exposes a portion of the RDL pattern 140, thereby establishing the position of the solder bump 160. In one aspect of the invention, the second insulating layer is formed from BCB, PI and EMC. The solder bump 160 is attached to the exposed portion of the RDL pattern 140, and transmits electrical signals to a board (not shown).

Figure 11:
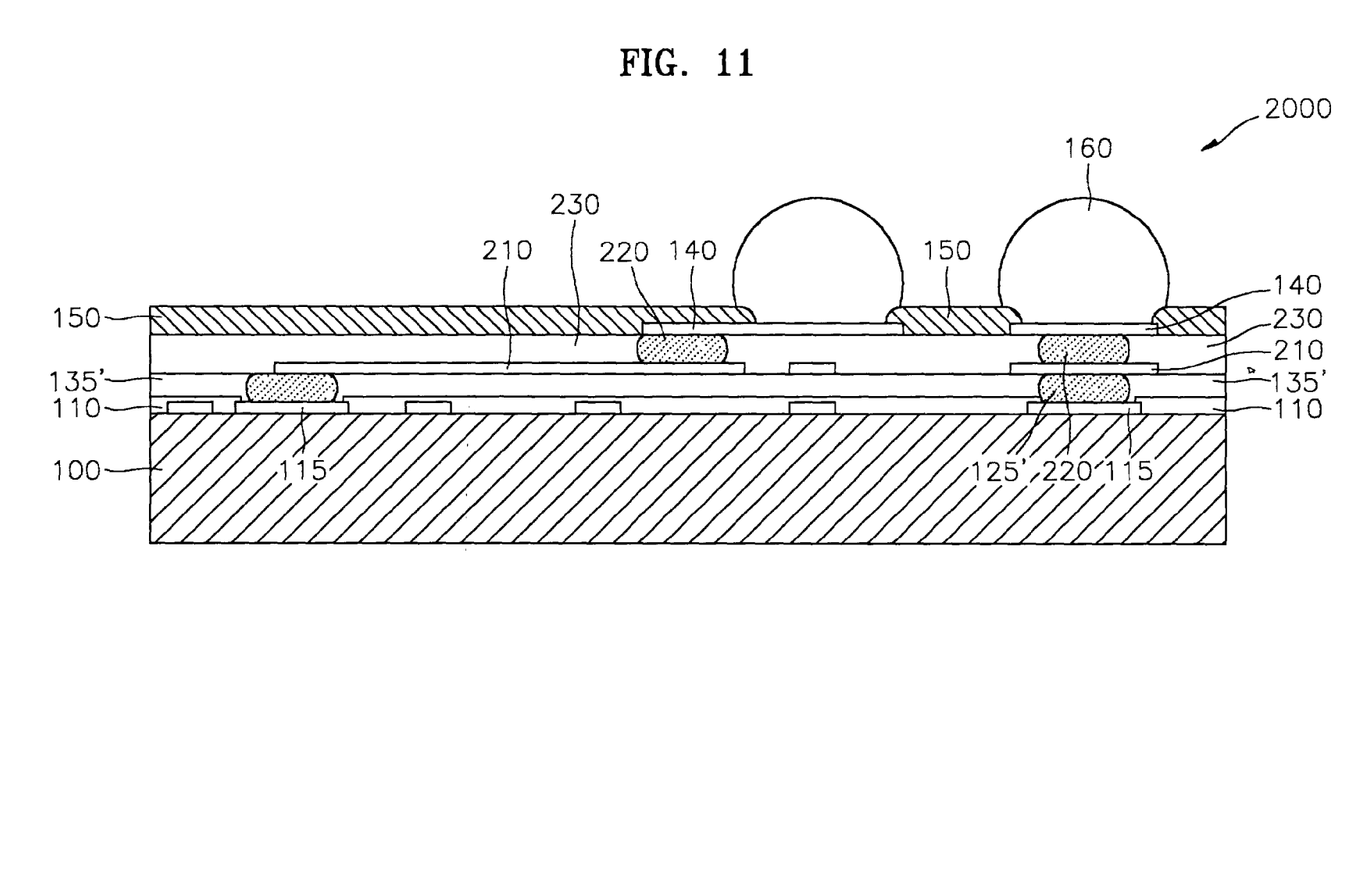
FIG. 11 is a cross-sectional view of a wafer-level chip scale package according to another aspect of the invention.

FIG. 11 is a cross-sectional view for explaining a wafer-level chip scale package further having a two-layered RDL pattern compared to that of FIG. 10. Referring to FIG. 11, a wafer-level chip scale package 2000 includes a silicon substrate 100 having a passivation layer 110 and chip pads 115; stud bumps 125' that are formed on the chip pads 115 and are encircled by a first insulating layer 135'; intermediate RDL patterns 210 that connect the stud bumps 125' and intermediate stud bumps 220; an intermediate insulating layer 230 that insulates the intermediate RDL patterns 210; RDL patterns 140 that connect the intermediate stud bumps 220 and solder bumps 160; a second insulating layer 150 that insulates the RDL patterns 140; and solder bumps 160 that are electrically attached to a portion of each of the RDL patterns 140. Here, components not described in FIG. 11 are the same as those components explained with reference to FIG. 10, and thus an explanation for those components will be omitted. Also, the same reference numerals in FIGS. 10 and 11 denote the same elements that have the same functions and are formed of the same materials.

The structure, functions, material, and effects of the intermediate stud bumps 220, the intermediate RDL patterns 210 and the intermediate insulating layer 230 are the same as those of the stud bump 125, the RDL pattern 140, and the second insulating layer 150, respectively. Hereinafter, any difference in structure, functions, material, or effects will be described.

The intermediate stud bumps 220 connect the intermediate RDL patterns 210 and the RDL patterns 140 electrically. Each intermediate RDL pattern 210 is formed at the bottom of each RDL pattern 140. The intermediate insulating layer 230 exposes a portion of the intermediate RDL patterns 210 to be connected with the intermediate stud bumps 220.

In one aspect of the invention, the intermediate stud bumps 220, the intermediate RDL patterns 210, and the intermediate insulating layer 230 may form several layers depending on the number of intermediate RDL patterns 210.

In a wafer-level chip scale package according to the invention, it is possible to prevent the formation of an inclined portion on a RDL pattern formed between a solder bump and a chip pad, thus suppressing the occurrence of cracks in the RDL pattern. Also, an inclined portion in the RDL pattern is prevented, and therefore cracks hardly occur even though an insulating layer may be thickly formed. Therefore, it is possible to enhance the reliability of a wafer-level chip scale package according to the invention. Further, a stud bump, which electrically connects the RDL pattern and the chip pad, can be easily and inexpensively formed using a capillary.

Having described these aspects of the invention, it is understood that the invention defined by the appended claims is not to be limited by particular details set forth in the above description, as many apparent variations thereof are possible without departing from the spirit or scope thereof.

What is claimed is:

1. A wafer-level chip scale package comprising:
   a silicon substrate having a passivation layer and a chip pad on its top surface;
   a stud bump being formed on the chip pad and encircled by a first insulating layer;
   a substantially planar re-distributed line (RDL) pattern being formed directly on the same horizontal surface as the first insulating layer and the stud bump, the RDL pattern for connecting the stud bump and a solder bump;
   a second insulating layer for insulating the RDL pattern so that a portion of the RDL pattern that is connected with the solder bump is exposed; and
   the solder bump being attached to the exposed portion of the RDL pattern.

2. The wafer-level chip scale package of claim 1, wherein the RDL pattern is formed to cover the entire top surface of the stud bump or to cover a portion thereof.

3. The wafer-level chip scale package of claim 1, wherein the stud bump is formed of one material selected from the group of Au and Cu.

4. The wafer-level chip scale package of claim 1, wherein the RDL pattern comprises a composite layer of Cu, Al, Cr, and Cu, or a material selected from one of NiV and Ti.

5. The wafer-level chip scale package of claim 1, wherein the first insulating layer is formed of one material selected from the group of BCB, PI, and EMC.

6. The wafer-level chip scale package of claim 1, wherein the second insulating layer is formed of one material selected from the group of BCB, PI, and EMC.

7. The wafer-level chip scale package of claim 1, wherein the top surface of the stud bump is aligned with the top surface of the first insulating layer.

8. A method of fabricating a wafer-level chip scale package, the method comprising:
   (a) preparing a silicon substrate having a passivation layer and a chip pad;
   (b) forming a stud bump on the chip pad;
   (c) depositing a first insulating layer on the stud bump and the chip pad;
   (d) planarizing the stud bump and the first insulating layer until the stud bump is exposed;
   (e) forming a substantially planar RDL pattern directly on the stud bump and first insulating layer for electrically connecting the stud bump and a solder bump;
   (f) forming a second insulating layer on the RDL pattern and the first insulating layer so that a portion of the RDL pattern, which is connected with the solder bump, is exposed; and
   (g) attaching the solder bump to the exposed portion of the RDL pattern.

9. A wafer-level chip scale package comprising:
   a stud bump on a chip pad;
   a first insulating layer proximate the stud bump; and a substantially planar re-distributed line (RDL) pattern directly on the first insulating layer and the stud bump, wherein the RDL pattern electrically connects the stud bump and a solder bump.

10. The wafer-level chip scale package of claim 9, wherein the RDL pattern covers the entire top surface of the stud bump.

11. The wafer-level chip scale package of claim 9, wherein the stud bump comprises Au or Cu.

12. The wafer-level chip scale package of claim 9, wherein the RDL pattern comprises a composite layer of Cu, Al, Cr, and Cu.

13. The wafer-level chip scale package of claim 11, wherein the RDL pattern comprises NiV or Ti.

14. The wafer-level chip scale package of claim 9, wherein the first insulating layer comprises BCB, PI, or EMC.

15. The wafer-level chip scale package of claim 9, wherein the top surface of the stud bump and the top surface of the first insulating layer are substantially coplanar.

16. The wafer-level chip scale package of claim 9, further comprising a second insulating layer for insulating a portion of the RDL pattern while leaving a portion of the RDL pattern exposed.

17. A wafer-level chip scale package comprising:
a stud bump on a chip pad;
a first insulating layer encircling the stud bump; and
a substantially planar re-distributed line (RDL) pattern directly on the first insulating layer and the stud bump, wherein the top surface of the stud bump and the top surface of the first insulating layer are substantially coplanar, and wherein the RDL pattern electrically connects the stud bump and a solder bump.

18. The wafer-level chip scale package of claim 17, wherein the RDL pattern is formed to cover the entire top surface of the stud bump.

19. The wafer-level chip scale package of claim 17, further comprising a second insulating layer for insulating the RDL pattern while exposing a portion of the RDL pattern.

20. A packaged semiconductor device, comprising:
a stud bump on a chip pad;
a first insulating layer proximate the stud bump; and
a substantially planar re-distributed line (RDL) pattern directly on the first insulating layer and the stud bump, wherein the RDL pattern electrically connects the stud bump and a solder bump.

21. A method of fabricating a wafer-level chip scale package, the method comprising:
forming a stud bump on a chip pad;
depositing a first insulating layer on the stud bump and the chip pad;
planarizing a portion of the stud bump and the first insulating layer; and
forming a substantially planar RDL pattern directly on the stud bump and first insulating layer for electrically connecting the stud bump and a solder bump.

22. The method of claim 21, wherein the stud bump and first insulating layer are planarized until the stud bump is exposed.

23. The method of claim 22, wherein the planarized surfaces of the stud bump and first insulating layer are substantially coplanar.

24. The method of claim 23, wherein the RDL pattern is formed to be planar.

25. The method of claim 24, wherein the RDL pattern is formed to cover the entire planarized surface of the stud bump.

26. The method of claim 21, further comprising forming a second insulating layer on the RDL pattern, the first insulating layer, and the stud bump, wherein a portion of the RDL pattern is exposed.

27. The method of claim 26, further comprising electrically connecting a solder bump to the exposed portion of the RDL pattern.

28. A method for making wafer-level chip scale package, comprising:
providing a stud bump on a chip pad;
providing a first insulating layer proximate the stud bump; and
providing a substantially planar re-distributed line (RDL) pattern directly on the first insulating layer and the stud bump, wherein the RDL pattern electrically connects the stud bump and a solder bump.

29. A method for making a packaged semiconductor device, comprising:
providing a stud bump on a chip pad;
providing a first insulating layer proximate the stud bump; and
providing a substantially planar re-distributed line (RDL) pattern directly on the first insulating layer and the stud bump, wherein the RDL pattern electrically connects the stud bump and a solder bump.

* * * * *